US009493338B2

United States Patent
Nakagawa et al.

(10) Patent No.: US 9,493,338 B2
(45) Date of Patent: Nov. 15, 2016

(54) CAPACITANCE TYPE SENSOR AND METHOD OF MANUFACTURING THE SAME

(71) Applicant: OMRON Corporation, Kyoto-Shi, Kyoto (JP)

(72) Inventors: Yusuke Nakagawa, Kyoto (JP); Takashi Kasai, Shiga (JP); Yoshitaka Tatara, Shiga (JP)

(73) Assignee: OMRON Corporation, Kyoto (JP)

( * ) Notice: Subject to any disclaimer, the term of this patent is extended or adjusted under 35 U.S.C. 154(b) by 13 days.

(21) Appl. No.: 14/373,547

(22) PCT Filed: Nov. 14, 2012

(86) PCT No.: PCT/JP2012/079568
§ 371 (c)(1),
(2) Date: Jul. 21, 2014

(87) PCT Pub. No.: WO2013/121640
PCT Pub. Date: Aug. 22, 2013

(65) Prior Publication Data
US 2014/0367811 A1   Dec. 18, 2014

(30) Foreign Application Priority Data

Feb. 15, 2012 (JP) .................................. 2012-031055

(51) Int. Cl.
*G01H 11/06* (2006.01)
*B81B 3/00* (2006.01)
(Continued)

(52) U.S. Cl.
CPC ........... *B81B 3/0021* (2013.01); *B81B 3/0056* (2013.01); *B81C 1/00158* (2013.01);
(Continued)

(58) Field of Classification Search
CPC ................. B81B 3/0021; B81B 3/0056; B81B 2201/0264; B81B 2203/0127; G01H
(Continued)

(56) References Cited

U.S. PATENT DOCUMENTS 6,686,639 B1 * 2/2004 Tsai ...................... B81B 3/0021
257/415
8,012,785 B2 * 9/2011 Liang .................. B81C 1/00246
257/414
(Continued)

FOREIGN PATENT DOCUMENTS

JP    2006-157863    *  6/2006    ............. H04R 19/04
JP    2006-157863 A    6/2006
(Continued)

OTHER PUBLICATIONS

International Search Report for corresponding International Application No. PCT/JP2012/079568, mailed Dec. 25, 2012 (4 pages).

*Primary Examiner* — Victoria K Hall
(74) *Attorney, Agent, or Firm* — Osha Liang LLP

(57) ABSTRACT

A capacitance type sensor has a semiconductor substrate having a vertically opened penetration hole, a movable electrode film arranged above the penetration hole such that a periphery portion opposes to a top surface of the semiconductor substrate with a gap provided, and a fixed electrode film arranged above the movable electrode film with a gap with respect to the movable electrode film. A concave portion having at least a part thereof formed by an inclined surface is provided in the top surface of the semiconductor substrate in a region of the top surface of the semiconductor substrate which overlaps the periphery portion of the movable electrode film.

9 Claims, 15 Drawing Sheets

(51) Int. Cl.
  *H04R 19/00* (2006.01)
  *H04R 31/00* (2006.01)
  *B81C 1/00* (2006.01)
  *G01L 9/12* (2006.01)
  *H04R 19/04* (2006.01)

(52) U.S. Cl.
  CPC .............. *G01H 11/06* (2013.01); *G01L 9/12* (2013.01); *H04R 19/005* (2013.01); *H04R 31/00* (2013.01); *B81B 2201/0264* (2013.01); *B81B 2203/0127* (2013.01); *H04R 19/04* (2013.01)

(58) Field of Classification Search
  CPC .............. 11/06; G01L 9/12; B81C 1/00158; H04R 31/00; H04R 19/04; H04R 19/005; H04R 31/006
  USPC .............. 257/254, 416; 73/649; 367/181
  See application file for complete search history.

(56) References Cited

U.S. PATENT DOCUMENTS

| | | | | |
|---|---|---|---|---|
| 9,066,180 B2 * | 6/2015 | Zoellin | ............... | H04R 19/005 |
| 9,102,519 B2 * | 8/2015 | Dehe | ............... | B81C 1/00182 |
| 9,249,008 B2 * | 2/2016 | Hsu | ............... | B81B 3/0086 |
| 2007/0261910 A1 | 11/2007 | Kasai et al. | | |
| 2010/0038734 A1 | 2/2010 | Kasai et al. | | |
| 2011/0179876 A1 | 7/2011 | Kasai et al. | | |

FOREIGN PATENT DOCUMENTS

| | | | | |
|---|---|---|---|---|
| JP | 2008-98524 | * | 4/2008 | ............ H01L 29/84 |
| JP | 2008-098524 A | | 4/2008 | |
| JP | 2010-34641 | * | 2/2010 | ............ H04R 19/04 |
| JP | 2010-34641 A | | 2/2010 | |

* cited by examiner

CAPACITANCE TYPE SENSOR AND METHOD OF MANUFACTURING THE SAME

BACKGROUND

1. Technical Field

The present invention relates to a capacitance type sensor. More particularly, the present invention relates to a capacitance type sensor such as an acoustic sensor or a pressure sensor which is manufactured using a MEMS (Micro Electro Mechanical Systems) technique.

2. Related Art (Conventional Acoustic Sensor)

An acoustic sensor is known as a capacitance type sensor which is manufactured using a MEMS technique. FIG. 1A illustrates part of a conventional capacitance type acoustic sensor. This acoustic sensor is provided with diaphragm 13 (movable electrode film) on silicon substrate 11 including penetration hole 12, and has fixed electrode film 16 opposite to diaphragm 13 with a gap provided above diaphragm 13. Fixed electrode film 16 is provided to a bottom surface of dome-shaped protective film 15 provided above penetration hole 12 to cover diaphragm 13. Multiple acoustic holes 17 are opened in protective film 15 and fixed electrode film 16 to introduce acoustic vibration in a gap between fixed electrode film 16 and diaphragm 13.

When acoustic vibration passes through acoustic holes 17 and enters a gap between fixed electrode film 16 and diaphragm 13, the acoustic vibration vibrates diaphragm 13. The vibration of diaphragm 13 changes the capacitance between diaphragm 13 and fixed electrode film 16, and the acoustic vibration is converted into an electrical signal. Further, vent hole 14 is provided between a bottom surface of a periphery portion of diaphragm 13 and a top surface of silicon substrate 11, and a top surface side and a bottom surface side of diaphragm 13 communicate through vent hole 14 to relax a pressure difference between the top and bottom surfaces of diaphragm 13.

An acoustic sensor of such a structure reduces acoustic noise and improves an S/N ratio by reducing an acoustic resistance. It is known that the acoustic resistance of the acoustic sensor becomes high at a narrow portion of a channel for acoustic vibration, and it is known that the acoustic resistance becomes the highest in a vent hole in particular. Consequently, it is effective to reduce an acoustic resistance of a vent hole to reduce an acoustic resistance of an acoustic sensor.

A method of making length L of vent hole 14 short by widening penetration hole 12 of silicon substrate 11 is generally adopted as a method of reducing an acoustic resistance of a vent hole. However, as described below, the method of making length L of vent hole 14 short has reduced drop impact resistance when the acoustic sensor is dropped.

As illustrated in FIG. 1A, even when the acoustic sensor is dropped and diaphragm 13 significantly deflects downward, as long as length L of vent hole 14 is sufficiently secured, a periphery portion of diaphragm 13 (a fixed portion of diaphragm 13 and an intermediate portion of the fixed portion) abuts on the top surface of silicon substrate 11 as indicated by a broken line in FIG. 1A. As a result, a relatively wide range of the periphery portion of diaphragm 13 is supported by the top surface of silicon substrate 11, so that it is possible to suppress deflection of diaphragm 13 and prevent diaphragm 13 from being broken. By contrast with this, when penetration hole 12 is widened as illustrated in FIG. 1B and length L of vent hole 14 is made short, only an end of the periphery portion of diaphragm 13 is supported by the top surface of silicon substrate 11 when the acoustic sensor is dropped as indicated by a broken line in FIG. 1B. As a result, when the acoustic sensor is dropped, diaphragm 13 is likely to significantly deflect downward and be broken.

Thus, reducing an acoustic resistance of an acoustic sensor (improvement of an S/N ratio) and keeping or enhancing a drop impact resistance have a trade-off relationship in a conventional acoustic sensor, and it is difficult to simultaneously enhance both of the acoustic resistance and the drop impact resistance.

(Acoustic Sensor of Patent Document 1)

The acoustic sensor disclosed in Patent Document 1 is provided with air escape portion 19 formed with a vertical hole or a groove whose cross-section is rectangular in the top surface of silicon substrate 11 in vent hole 14 as illustrated in FIG. 2. According to this structure, the cross-sectional area of vent hole 14 partially becomes large at the position of air escape portion 19, so that it is possible to reduce the acoustic resistance of vent hole 14.

However, the acoustic sensor of this structure needs to be manufactured as follows. Air escape portion 19 formed with a vertical hole or a groove whose cross section is rectangular is opened in the top surface of silicon substrate 11 by dry etching, and a lower sacrificial layer, a diaphragm layer and an upper sacrificial layer are stacked on the top surface of silicon substrate 11 to make this acoustic sensor. After these layers are etched to predetermined shapes, protective film 15 and fixed electrode film 16 are formed on the upper sacrificial layer. Next, the bottom surface side of silicon substrate 11 is etched to open penetration hole 12, and the upper sacrificial layer and the lower sacrificial layer are removed by etching to form a gap between diaphragm 13 and protective film 15 and vent hole 14.

The acoustic sensor of Patent Document 1 manufactured in this way needs to make air escape portion 19 deep to some degree to reduce the acoustic resistance of vent hole 14. Therefore, a concavity meeting the position of air escape portion 19 is produced in a top surface of the lower sacrificial layer, and further a concavity is also produced in a top surface of the diaphragm layer. As a result, the shape of air escape portion 19 is transferred to diaphragm 13, and a concave portion and a convex portion are finally produced in the top surface and the bottom surface of diaphragm 13, respectively. These concave portion and convex portion influence a stress state of diaphragm 13 and eventually influence the sensitivity of the acoustic sensor.

However, when the depth of air escape portion 19 is decreased to such a degree that the shape is not transferred to diaphragm 13, it is not possible to provide an effect of reducing the acoustic resistance of vent hole 14.

Further, the acoustic sensor of Patent Document 1 needs to be provided with air escape portion 19 by dry etching as described above, and therefore the number of manufacturing processes increases and manufacturing cost rises.

Patent Document 1: Japanese Unexamined Patent Publication No. 2010-34641 (FIG. 10)

SUMMARY

One or more embodiments of the present invention provides a capacitance type sensor and a capacitance type sensor manufacturing method which can reduce a resistance in a gap between a movable electrode film and a top surface of a substrate while keeping or enhancing a drop impact resistance and, moreover, which does not make a manufacturing process complicated.

A capacitance type sensor according to one or more embodiments of the present invention has: a semiconductor substrate configured to include a vertically opened penetration hole; a movable electrode film configured to be arranged above the penetration hole such that a periphery portion is opposite to a top surface of the semiconductor substrate with a gap provided; and a fixed electrode film configured to be arranged above the movable electrode film with a gap with respect to the movable electrode film, and a concave portion configured such that at least part of the concave portion is formed by an inclined surface provided in the top surface of the semiconductor substrate in a region of the top surface of the semiconductor substrate which overlaps the periphery portion of the movable electrode film, the concave portion is formed such that, in at least part of an opening of a top surface of the concave portion to a bottom surface side of the semiconductor substrate, a cross-sectional area of the concave portion parallel to the top surface of the semiconductor substrate becomes smaller from the opening of the top surface of the concave portion to the bottom surface side of the semiconductor substrate, and an inclined surface of the concave portion is a densest surface of the semiconductor substrate.

In the capacitance type sensor according to one or more embodiments of the present invention, a region in which the periphery portion of the movable electrode film and the top surface of the semiconductor substrate overlap is provided. That is, a concave portion is provided in the top surface of the semiconductor substrate such that at least part of the concave portion overlaps the vent hole. Consequently, the cross-sectional area of the vent hole becomes large at a portion at which the concave portion is provided and the resistance (acoustic resistance) of the vent hole is reduced. Consequently, it is possible to reduce the resistance of the vent hole without making the length of the vent hole short. As a result, it is possible to reduce the resistance of the vent hole without deteriorating the drop impact resistance of the capacitance type sensor, reduce noise of the capacitance type sensor and improve the S/N ratio. Moreover, in the capacitance type sensor according to one or more embodiments of the present invention, the concave portion is formed such that, in at least part of the opening of the top surface of the concave portion to the bottom surface side of the substrate, the cross-sectional area of the concave portion parallel to the top surface of the semiconductor substrate becomes smaller from the opening of the top surface of the concave portion to the bottom surface side of the substrate. Consequently, it is possible to widen the concave portion on a side in contact with the vent hole and reduce the resistance of the vent hole.

Further, in the capacitance type sensor according to one or more embodiments of the present invention, at least part of the concave portion is formed with the inclined surfaces formed with densest surfaces of the semiconductor substrate. For example, when the semiconductor substrate is a (100) plane substrate, the inclined surfaces become a (111) plane and a crystal plane equivalent to the (111) plane. As a result, it is possible to make the concave portion of a stable shape by anisotropic wet etching (using isotropic wet etching in combination when necessary), and prevent a process of manufacturing the capacitance type sensor from being complicated.

In a capacitance type sensor according to one or more embodiments of the present invention, the concave portion is formed in a groove shape or a reverse quadrangular pyramidal shape. Meanwhile, the groove shape is a concave shape formed by a trajectory of a given cross-sectional shape which continuously moves along an arbitrary straight line or a curve. However, the cross-sectional shape does not need to be fixed, the size or the shape of the cross-sectional shape may be changed as the cross-sectional shape moves along an arbitrary straight line or curve. As long as the concave portion is formed in the groove shape in one or more embodiments, the volume of the concave portion can be increased, so that an effect of reducing the resistance of the vent hole becomes high. Further, when concave portions of reverse quadrangular pyramidal shapes are aligned, it is possible to improve the degree of freedom of adjusting the resistance of the vent hole by adjusting intervals to arrange the concave portions.

In a capacitance type sensor according to one or more embodiments of the present invention, a plurality of linearly extending concave portions is provided along a rim of the penetration hole in the top surface of the semiconductor substrate. According to one or more embodiments, the concave portion does not include a bent portion when seen from a direction vertical to the top surface of the substrate. Consequently, anisotropic etching progressing toward an inner corner direction from the bent portion of the concave portion when the concave portion is subjected to anisotropic etching does not occur.

In a capacitance type sensor according to one or more embodiments of the present invention, the movable electrode film includes at least one stopper configured to project toward a horizontal surface of the top surface of the semiconductor substrate which is not provided with the concave portion in a region in which the movable electrode film opposite to the top surface of the semiconductor substrate with a gap provided. According to one or more embodiments, it is possible to prevent a phenomenon that, when the movable electrode film significantly deflects downward, the stopper abuts on the top surface of the semiconductor substrate, and the periphery portion of the movable electrode film adheres to the top surface of the semiconductor substrate.

A method of manufacturing a capacitance type sensor according to one or more embodiments of the present invention having: a semiconductor substrate configured to include a vertically opened penetration hole; a movable electrode film configured to be arranged above the penetration hole such that a periphery portion opposite to a top surface of the semiconductor substrate with a gap provided; and a fixed electrode film configured to be arranged above the movable electrode film with a gap with respect to the movable electrode film, and including a concave portion configured such that at least part of the concave portion is formed by an inclined surface, in the top surface of the semiconductor substrate in a region of the top surface of the semiconductor substrate which overlaps the periphery portion of the movable electrode film, includes: a step of forming a first sacrificial layer on the top surface of the semiconductor substrate in a region sandwiched by a region configured to become an opening of a top surface of the penetration hole and a region in which the concave portions is formed; a step of forming a second sacrificial layer to cover the top surface of the region in which the concave portion is formed and connect the top surface of the region in which the concave portion is formed and at least part of the region configured to become the opening of the top surface of the penetration hole; a step of providing the movable electrode film above the first and second sacrificial layers, and forming a third sacrificial layer to cover the first and second sacrificial layers and the movable electrode film; a step of providing the fixed electrode film above the third sacrificial layer; a step of etching a bottom surface of the semiconductor substrate, forming part or the entirety of the penetration hole in the semiconductor substrate and exposing the second sacrificial layer from a top surface of the penetration hole; a step of having a first etching solution contact the second sacrificial layer through the penetration hole and removing the second sacrificial layer; a step of having a second etching solution contact the top surface of the semiconductor substrate through a cavity portion after the second sacrificial layer is removed, and forming the concave portion on the top surface of the semiconductor substrate; and a step of removing the first and third sacrificial layers by etching.

The method of manufacturing the capacitance type sensor according to one or more embodiments of the present invention can feed an etching solution to a region in which a concave portion is made, through the penetration hole opened in the silicon substrate and a cavity portion after the second sacrificial layer is removed. Consequently, it is possible to easily form the concave portion in the periphery portion of the penetration hole in the top surface of the semiconductor substrate by wet etching. Moreover, in this regard, by forming the concave portion by anisotropic wet etching (using isotropic wet etching in combination when necessary), it is possible to easily make the concave portion whose cross-sectional area parallel to the top surface of the semiconductor substrate at a lower end is smaller than an opening area of the opening of the top surface. When, for example, the (100) plane silicon substrate is used as the semiconductor substrate, it is possible to expose the (111) plane of the silicon substrate and the crystal plane equivalent to the (111) plane from the top surface of the concave portion by anisotropic etching and, consequently, and to make the inclined surfaces by the (111) plane and the crystal plane equivalent to the (111) plane. Moreover, by making the inclined surface by the crystal plane (densest plane) of the semiconductor substrate using anisotropic etching, the shape of the concave portion becomes stable and, eventually, characteristics of the capacitance type sensor becomes stable.

Further, in the capacitance type sensor made by this manufacturing method, a region in which the periphery portion of the movable electrode film and the top surface of the semiconductor substrate overlap is provided. That is, a concave portion is provided in the top surface of the semiconductor substrate such that at least part of the movable electrode film overlaps the vent hole. Consequently, the cross-sectional area of the vent hole becomes large at a portion at which the concave portion is provided and the resistance of the vent hole is reduced. Consequently, it is possible to reduce the resistance of the vent hole without making the length of the vent hole short. As a result, it is possible to reduce the resistance of the vent hole without deteriorating the drop impact resistance of the capacitance type sensor, and to reduce noise of the capacitance type sensor and improve the S/N ratio.

In a method of manufacturing the capacitance type sensor according to one or more embodiments of the present invention, the second sacrificial layer is formed over the top surface of the first sacrificial layer, and between the top surface of a region in which the concave portion is formed and at least part of the region configured to become the opening of the top surface of the penetration hole. According to one or more embodiments, it is possible to prevent the top surface of the semiconductor substrate from being etched at a portion other than the concave portion by an etching solution flowing in the cavity portion after the second sacrificial layer is removed.

In a method of manufacturing the capacitance type sensor according to one or more embodiments of the present invention, the same etching solution is used to form the penetration hole and remove the second sacrificial layer. In one or more embodiments, it is possible to continuously or simultaneously perform a process of opening the penetration hole in the semiconductor substrate by etching, a process of removing the second sacrificial layer and a process of forming the concave portion on the top surface of the semiconductor substrate by anisotropic etching, to simplify the process of manufacturing the capacitance type sensor and to reduce manufacturing cost.

In addition, the present invention includes features obtained by adequately combining the above-described components, and the present invention enables multiple variations by combinations of these components.

DETAILED DESCRIPTION

Embodiments of the present invention will be described below with reference to the accompanying drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

The present invention is not limited to the following embodiments, and various design changes can be made as long as the various design changes do not deviate from the spirit of the present invention. In addition, one or more embodiments of the present invention is applicable to a capacitance type sensor such as a capacitance type acoustic sensor or pressure sensor. However, a case where one or more embodiments of the present invention is applied to an acoustic sensor as a typical capacitance type sensor will be described below.

First Embodiment

Figure 1A:
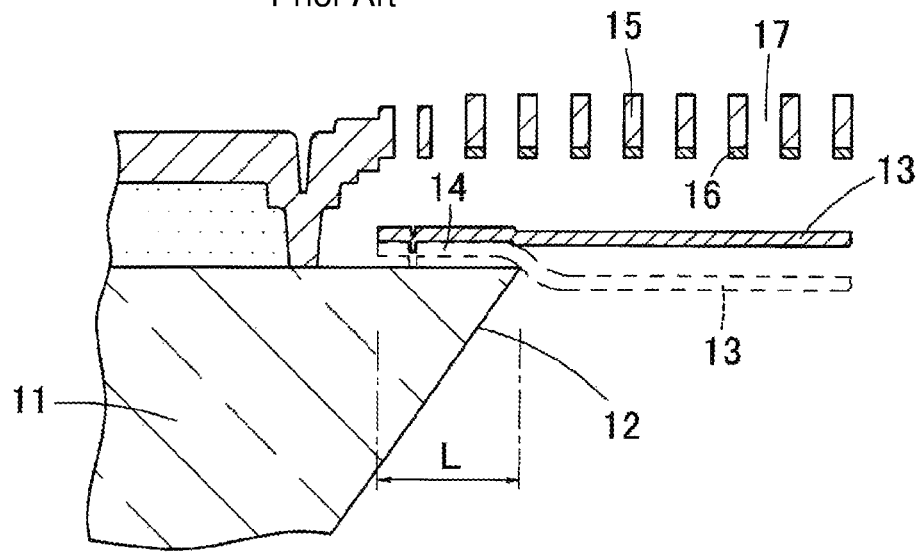
FIGS. 1A and 1B are cross-sectional views illustrating part of a conventional acoustic sensor.
Figure 1B:
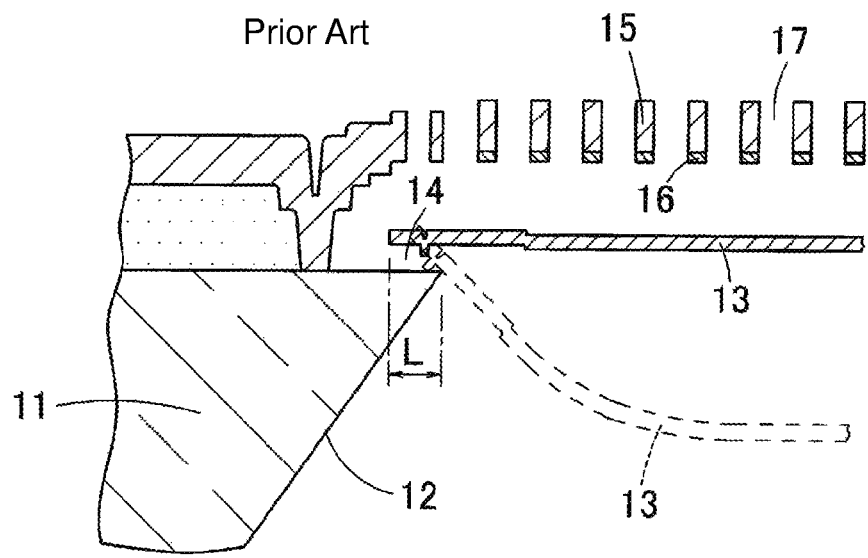
Figure 2:
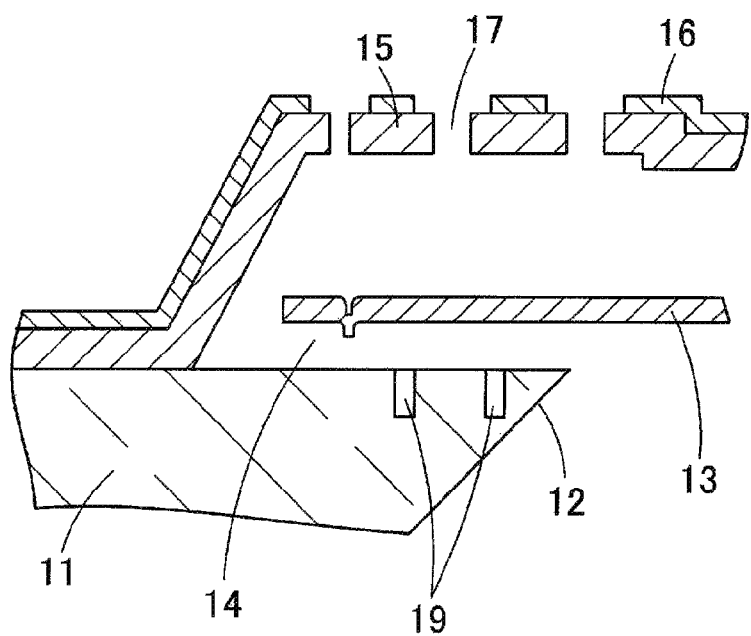
FIG. 2 is a cross-sectional view illustrating part of an acoustic sensor disclosed in Patent Document 1.
Figure 3:
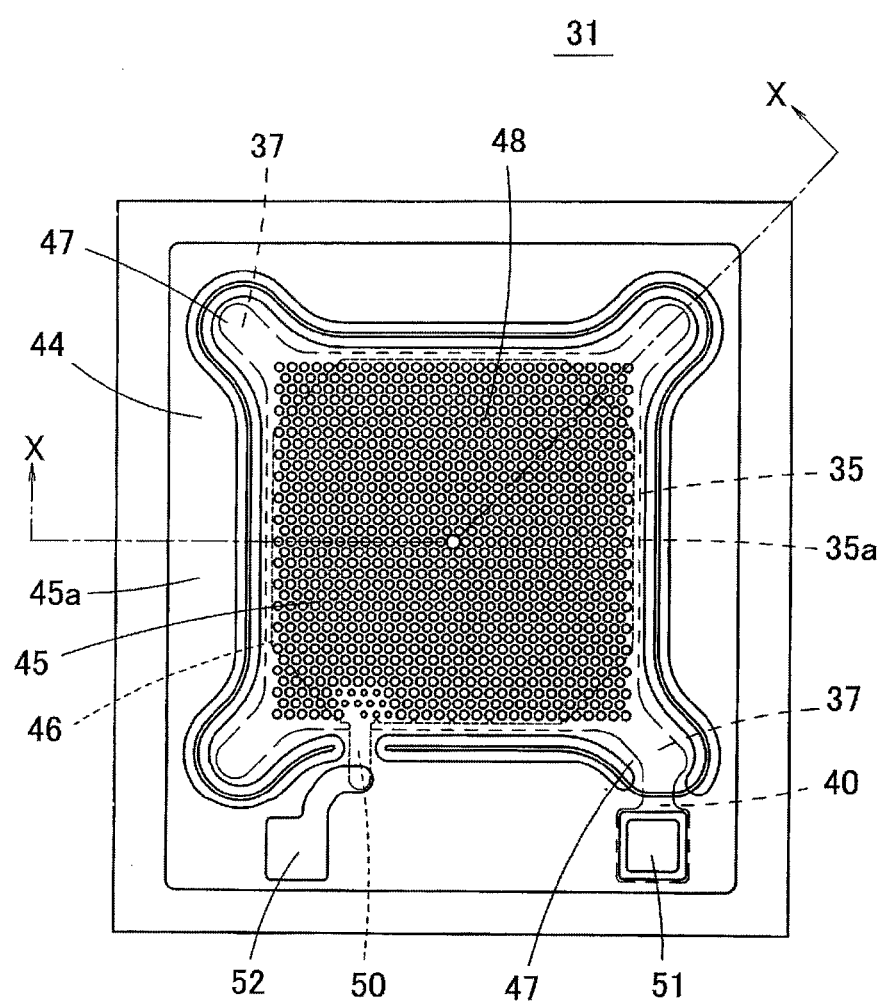
FIG. 3 is a plan view of an acoustic sensor of a first embodiment of the present invention.
Figure 4:
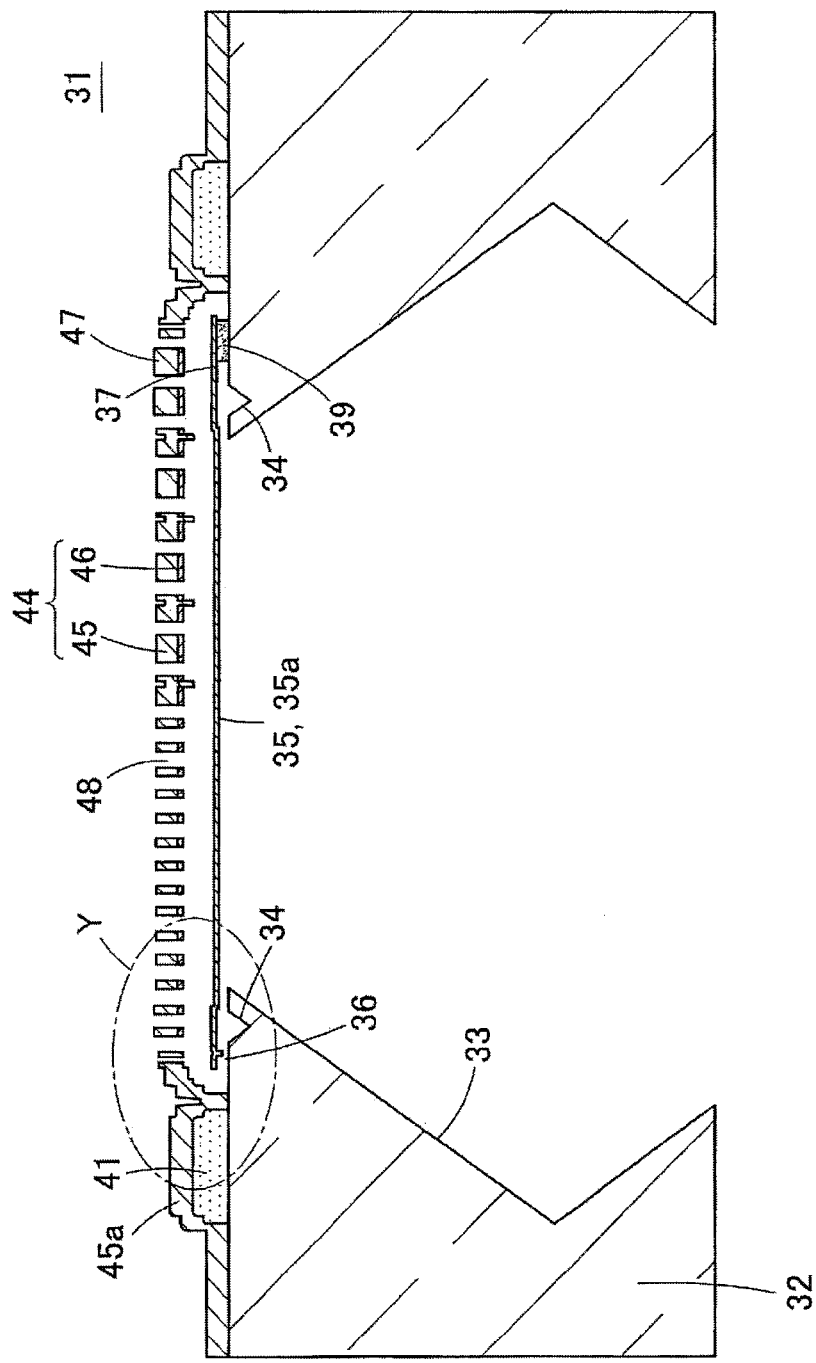
FIG. 4 is a cross-sectional view taken along an X-X line in FIG. 3.
Figure 5:
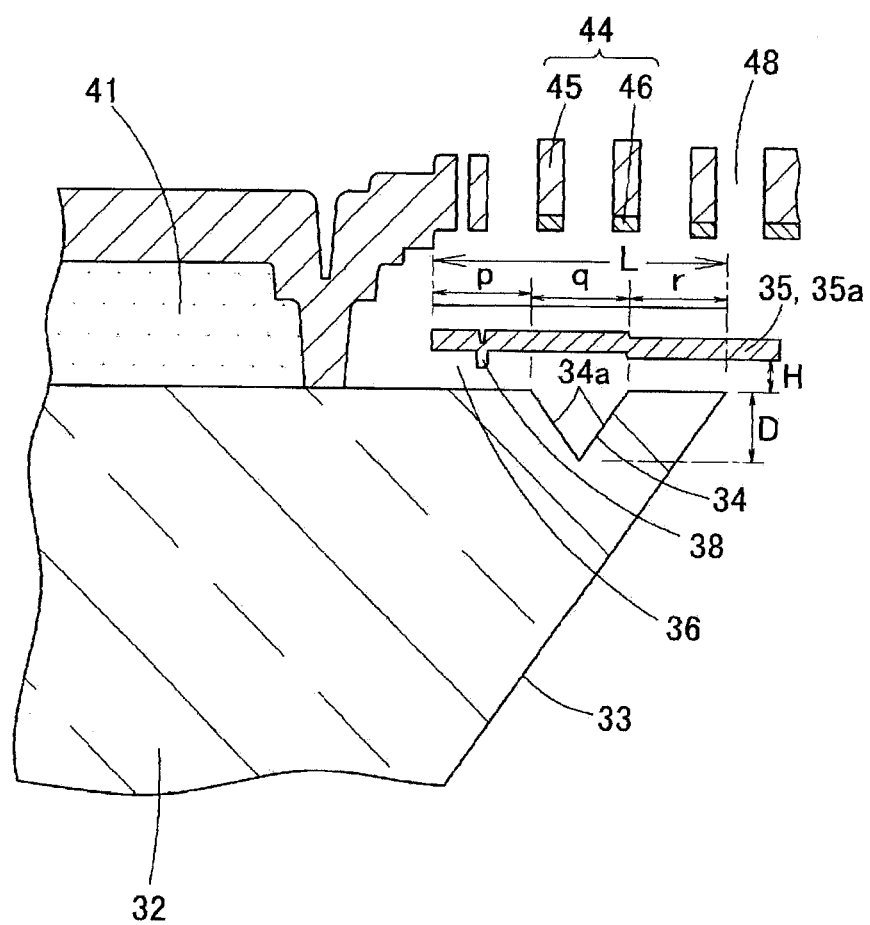
FIG. 5 is a view enlarging a Y portion in FIG. 4.
Figure 6A:
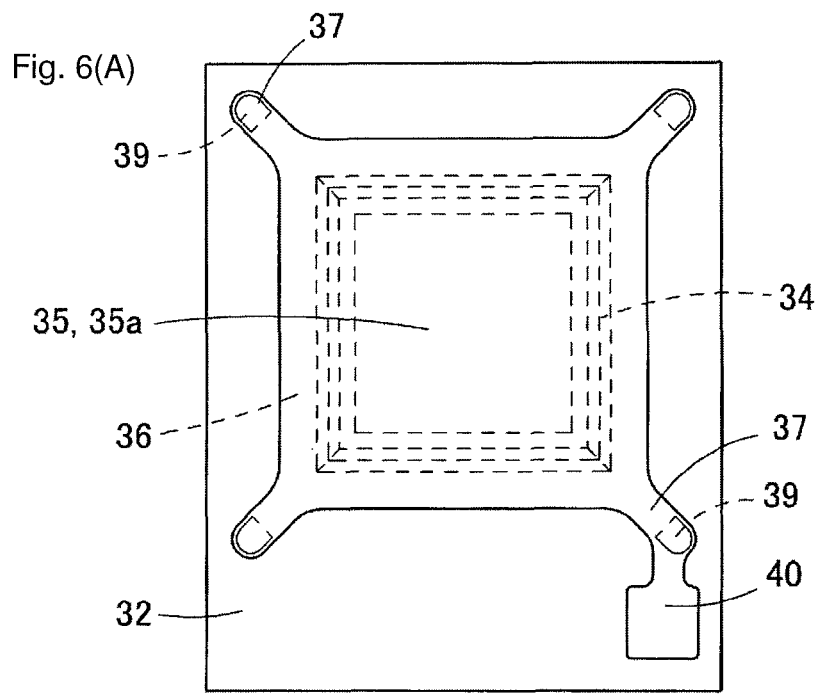
FIG. 6A is a plan view illustrating a diaphragm provided on a silicon substrate.
Figure 6B:
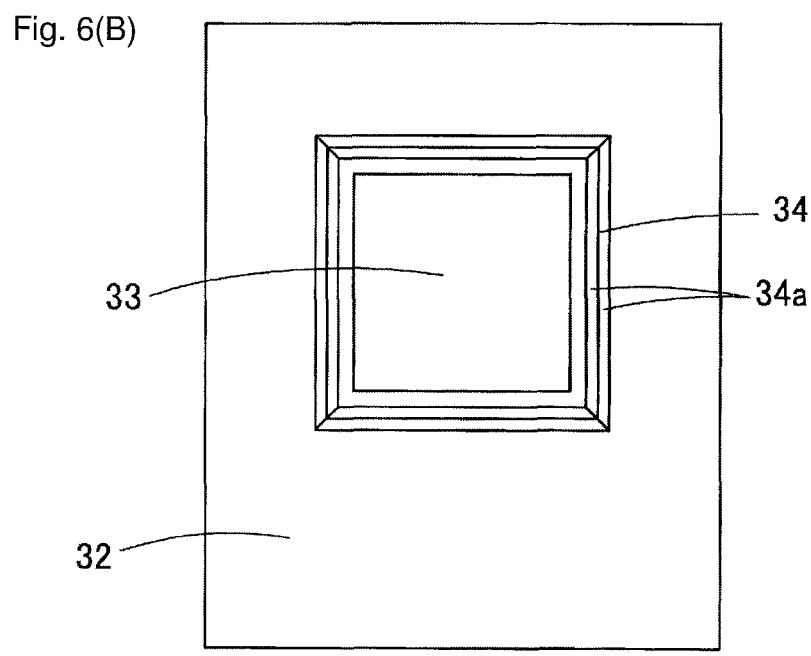
FIG. 6B is a plan view illustrating an air escape portion formed on a top surface of the silicon substrate.

A structure of an acoustic sensor of the first embodiment of the present invention will be described below with reference to FIGS. 3 to 6. FIG. 3 is a plan view of acoustic sensor 31 of the first embodiment of the present invention. FIG. 4 is a cross-sectional view of acoustic sensor 31 cut along an X-X line in FIG. 3. FIG. 5 is an enlarged view illustrating a Y portion in FIG. 4. FIG. 6A is a plan view illustrating diaphragm 35 provided on silicon substrate 32. FIG. 6B is a plan view illustrating air escape portion 34 formed on a top surface of silicon substrate 32.

This acoustic sensor 31 is a minute capacitance type element made using the MEMS technique. As illustrated in FIG. 4, diaphragm 35 is provided on the top surface of silicon substrate 32 (semiconductor substrate) via anchors 39, and back plate 44 is provided thereon with a minute air gap (gap) between the back plate 44 and the diaphragm 35.

Silicon substrate 32 is formed with a (100) plane silicon substrate. As illustrated in FIGS. 3 and 4, silicon substrate 32 is formed in a rectangular plate shape, and includes penetration hole 33 which penetrates the top surface to a bottom surface of silicon substrate 32. Penetration hole 33 is formed by wet-etching silicon substrate 32, and is formed with eight inclined surfaces formed with (111) planes and crystal planes equivalent to the (111) planes. Penetration hole 33 is formed in a rectangular shape seen from a direction vertical to the top surface of silicon substrate 32 (see FIG. 6B). A top half of silicon substrate 32 is formed in a truncated pyramidal shape and a lower half is formed in a reverse truncated pyramidal shape. In addition, this penetration hole 33 becomes a back chamber or a front chamber depending on the embodiment of acoustic sensor 31.

As illustrated in FIGS. 4, 5 and 6B, air escape portion 34 parallel to each side of penetration hole 33 extends to the circumference of penetration hole 33 in the top surface of silicon substrate 32. Each portion of air escape portion 34 is formed with two inclined surfaces 34a, and has a V groove shape. As described below, each inclined surface 34a is formed with the (111) plane of silicon substrate 32 and a crystal plane equivalent to the (111) plane, and includes an inclined angle of about 54.7° with respect to the top surface of silicon substrate 32. Further, air escape portion 34 is formed in a square annular shape to surround penetration hole 33.

Diaphragm 35 is formed with a polysilicon thin film whose film thickness is thin, and has conductivity. As illustrated in FIG. 6A, diaphragm 35 is formed by extending beam portions 37 from four corners of vibration thin film portion 35a of a rectangular shape toward an outside of a diagonal direction. Further, lead wiring 40 extends from one of beam portions 37.

As illustrated in FIGS. 4 and 6A, diaphragm 35 is arranged above silicon substrate 32 such that vibration thin film portion 35a covers penetration hole 33 and air escape portion 34. Each beam portion 37 of diaphragm 35 is fixed on anchor 39 provided on the top surface of silicon substrate 32. Hence, vibration thin film portion 35a of diaphragm 35 is spaced apart from the top surface of silicon substrate 32 above penetration hole 33, and can cause film vibration in response to acoustic vibration (air vibration).

Base portion 41 of a thick film is formed on the top surface of silicon substrate 32 to cover the circumference of diaphragm 35 without contacting diaphragm 35. Anchor 39 and base portion 41 are formed with oxide films ($SiO_2$).

Back plate 44 is formed by providing fixed electrode film 46 made of polysilicon in the bottom surface of plate portion 45 (protective layer) formed with a nitride film (SiN). Back plate 44 has a dome shape, includes a cavity portion therebelow and covers diaphragm 35. A minute air gap is formed between the bottom surface of back plate 44 (that is, the bottom surface of fixed electrode film 46) and the top surface of diaphragm 35. Further, beam portion cover regions 47 are formed at the corner portions of the plate portion 45 so as to cover beam portions 37 with a minute air gap provided between the beam portion cover regions 47 and the beam regions 37. Fixed electrode film 46 forms a capacitor opposite a vibration thin film portion 35a which is a movable electrode film. Further, lead wiring 50 extends from fixed electrode film 46.

Outer periphery portion 45a of plate portion 45 covers base portion 41, and an outer side of outer periphery portion 45a is fixed to the top surface of silicon substrate 32. Electrode pads 51 and 52 are provided on the top surface of outer periphery portion 45a of plate portion 45. One electrode pad 51 is electrically connected with lead wiring 40 penetrating plate portion 45, and is electrically connected with silicon substrate 32 via a through-hole (not illustrated) provided to plate portion 45. Further, other electrode pad 52 is electrically connected with lead wiring 50 penetrating plate portion 45, and is insulated from silicon substrate 32.

Multiple acoustic holes 48 are bored to penetrate back plate 44 from the top surface to the bottom surface to allow acoustic vibration to pass. Further, a small gap which becomes a channel for acoustic vibration, that is, vent hole 36 is formed between a bottom surface of the periphery portion of vibration thin film portion 35a and the top surface of silicon substrate 32 between beam portions 37.

However, when acoustic vibration passes through acoustic holes 48 and enters a space between back plate 44 and diaphragm 35 in this acoustic sensor 31, diaphragm 35 which is a thin film is excited by acoustic vibration and causes film vibration. Further, the acoustic vibration having entered in back plate 44 through acoustic holes 48 vibrates vibration thin film portion 35a, and part of the acoustic vibration goes to penetration hole 33 through vent hole 36. When vibration of diaphragm 35 changes a gap distance between diaphragm 35 and fixed electrode film 46, a capacitance between diaphragm 35 and fixed electrode film 46 changes. As a result, the acoustic vibration (a change of a sound pressure) which vibrates diaphragm 35 changes the capacitance between diaphragm 35 and fixed electrode film 46, and is outputted as an electrical signal.

Further, an area above air escape portion 34 is formed to cross the bottom surface of vent hole 36 along a direction orthogonal to the length direction of vent hole 36 (a direction in which length L illustrated in FIG. 5 is measured). Hence, when the length direction and the vertical cross section of vent hole 36 are taken into account, the cross-sectional area of vent hole 36 is larger at a position at which air escape portion 34 is provided than other portions. Air escape portion 34 can partially increase the cross-sectional area of vent hole 36 in this way, so that it is possible to reduce the acoustic resistance of vent hole 36, reduce noise of acoustic sensor 31 and improve the S/N ratio. Moreover, it is not necessary to make length L of vent hole 36 short. Consequently, when acoustic sensor 31 is dropped and diaphragm 35 deflects downward, a relatively wide area of the periphery portion of diaphragm 35 is supported by the top surface of silicon substrate 32. Consequently, it is possible to prevent diaphragm 35 from being significantly deflected downward, prevent diaphragm 35 from being broken and keep or enhance a drop impact resistance of diaphragm 35.

Further, in this acoustic sensor 31, air escape portion 34 can be formed after a sacrificial layer and a diaphragm layer are formed on the top surface of silicon substrate 32 as described below. Consequently, it is possible to stabilize the stress of diaphragm 35 without transferring the shape of air escape portion 34 to diaphragm 35. As a result, it is possible to reduce a sensitivity fluctuation of acoustic sensor 31.

Further, in vent hole 36, projection 38 (stopper) projects from the bottom surface of diaphragm 35 toward a flat region of silicon substrate 32 (a region other than air escape portion 34). Consequently, it is possible to prevent a phenomenon that, when diaphragm 35 significantly deflects downward, a lower end of projection 38 abuts on the top surface of silicon substrate 32, and the periphery portion of diaphragm 35 closely contacts the top surface of silicon substrate 32 and cannot be detached.

The dimension example of acoustic sensor 31 of the above structure is as follows. Length L of vent hole 36 illustrated in FIG. 5 is 60 μm, and height H of vent hole 36 is 2 μm. Further, width q of air escape portion 34 is 20 μm and depth D of air escape portion 34 is 14 μm, and air escape portion 34 is provided spaced r=20 μm apart from the rim of penetration hole 33. Hence, distance p (=D−q−r) from the end of air escape portion 34 to the end of diaphragm 35 is also 20 μm, and air escape portion 34 is provided in the center of vent hole 36 in the length direction.

The acoustic resistance of the portion (a q portion in FIG. 5) at which air escape portion 34 is formed can be substantially ignored compared to the other portions (p and r portions in FIG. 5) of vent hole 36. Consequently, according to this dimension example, the acoustic resistance of vent hole 36 is reduced to nearly ⅔ compared to a case where air escape portion 34 is not provided. However, length L of vent hole 36 is 60 μm, so that, when acoustic sensor 31 is dropped, the periphery portion of diaphragm 35 can be held fast by the top surface of silicon substrate 32 and it is possible to provide a sufficient drop impact resistance.

(Method of Manufacturing Acoustic Sensor)

Next, the method of manufacturing acoustic sensor 31 using the MEMS technique will be described with reference to FIGS. 7A to 7D, FIGS. 8A to 8D, FIGS. 9A to 9C and FIGS. 10A and 10B. In addition, these views are explanatory views, and therefore the base portion is not illustrated.

Figure 7A:
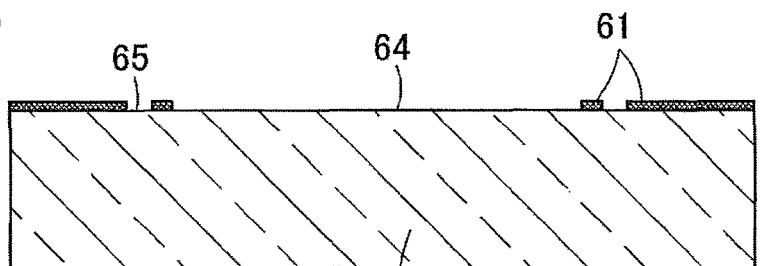
FIGS. 7A to 7D are schematic cross-sectional views schematically illustrating a process of manufacturing the acoustic sensor of the first embodiment of the present invention.
Figure 10A:
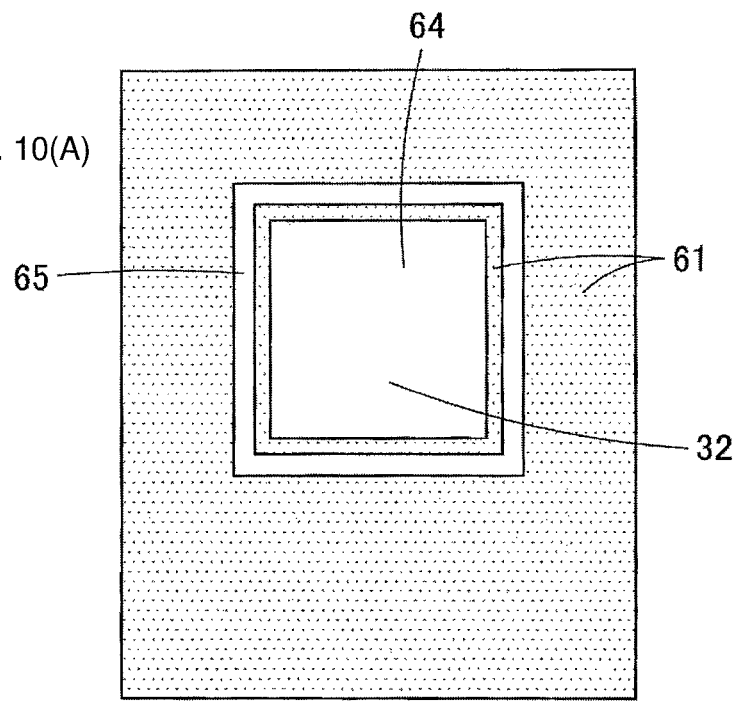
FIG. 10A is a plan view of a silicon substrate having a top surface on which a first sacrificial layer is formed.

First, as illustrated in FIGS. 7A and 10A, first sacrificial layer 61 formed with an oxide film ($SiO_2$) is formed on the top surface of (100) plane silicon substrate 32 by a CVD method. This first sacrificial layer 61 originally determines a size of an opening of the top surface of penetration hole 33 when penetration hole 33 is opened by etching, and is opened in region 64 which becomes penetration hole 33.

Further, in one or more embodiments of the present invention, first sacrificial layer 61 is also opened in region 65 which becomes air escape portion 34.

Figure 7B:
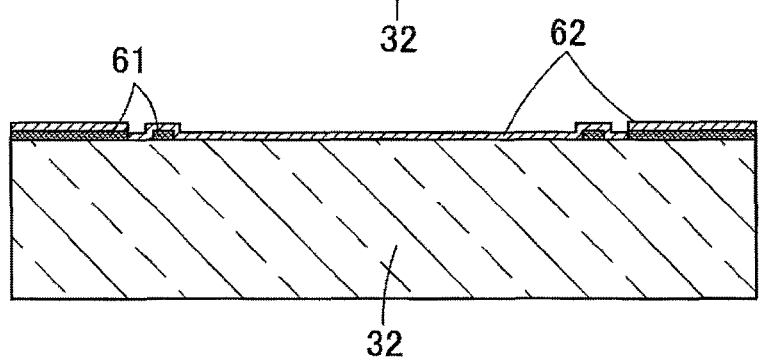
Figure 10B:
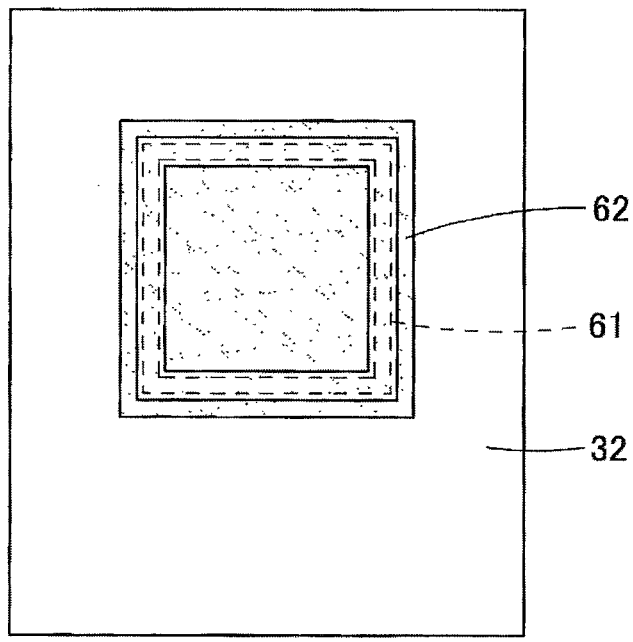
FIG. 10B is a plan view of a silicon substrate having a top surface on which a second sacrificial layer is formed.

As illustrated in FIG. 7B, second sacrificial layer 62 made of polysilicon is formed on first sacrificial layer 61 and on the top surface of silicon substrate 32. Further, by peeling first sacrificial layer 61 positioned outside region 65 which becomes air escape portion 34, from the top surface of silicon substrate 32, second sacrificial layer 62 on first sacrificial layer 61 is removed by a liftoff method. As a result, as illustrated in FIG. 10B, region 65 which becomes air escape portion 34 and a region on the inner side of region 65 in the top surface of silicon substrate 32 are covered by second sacrificial layer 62. An outer side of region 65 which becomes air escape portion 34 is exposed from second sacrificial layer 62. Further, second sacrificial layer 62 closely contacts the top surface of silicon substrate 32 in region 64 which becomes penetration hole 33 and region 65 which becomes air escape portion 34, and crosses first sacrificial layer 61 in the middle between both of regions 64 and 65.

Figure 7C:
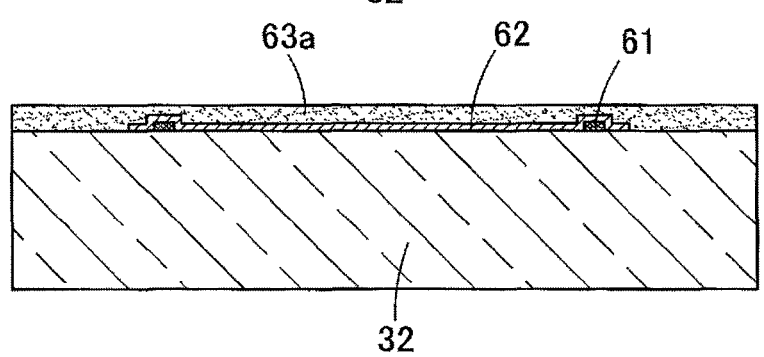
Figure 7D:
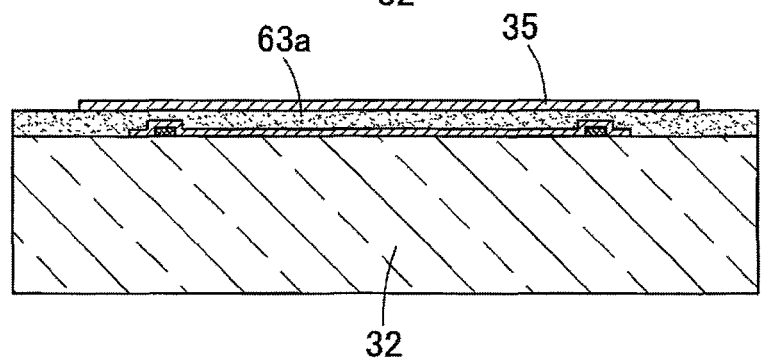

Subsequently, as illustrated in FIG. 7C, $SiO_2$ is deposited on second sacrificial layer 62 and on the entire top surface of silicon substrate 32 to form third sacrificial layer 63a. Further, as illustrated in FIG. 7D, a polysilicon layer is formed on third sacrificial layer 63a, and is patterned by etching to form diaphragm 35 made of polysilicon, on a top surface of third sacrificial layer 63 as illustrated in FIG. 7D.

Figure 8A:
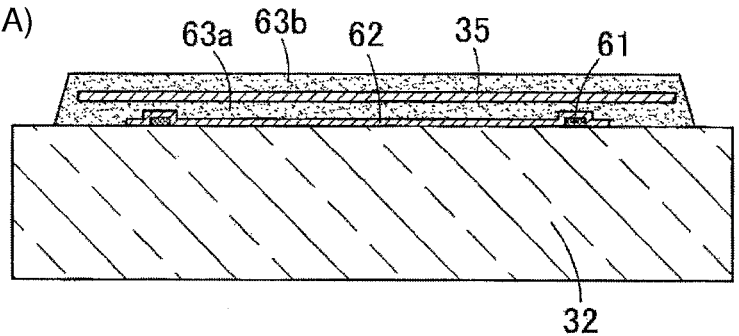
FIGS. 8A to 8D are views continuing from FIGS. 7A to 7D.
Figure 8B:
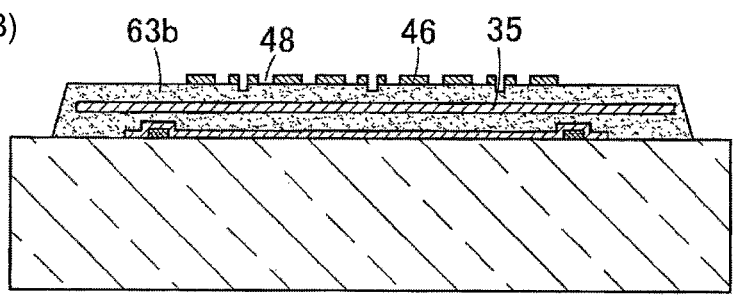

As illustrated in FIG. 8A, third sacrificial layer 63b made of $SiO_2$ is further deposited on diaphragm 35 and on silicon substrate 32 to cover diaphragm 35 by third sacrificial layer 63b. Next, third sacrificial layers 63a and 63b wrapping second sacrificial layer 62 and diaphragm 35 are etched to make the inner surface shape of back plate 44 by third sacrificial layers 63a and 63b. The polysilicon film is formed on the top surface of this third sacrificial layer 63b and, as illustrated in FIG. 8B, fixed electrode film 46 is made by patterning the polysilicon film by etching. In this regard, acoustic holes 48 are opened in fixed electrode film 46.

Figure 8C:
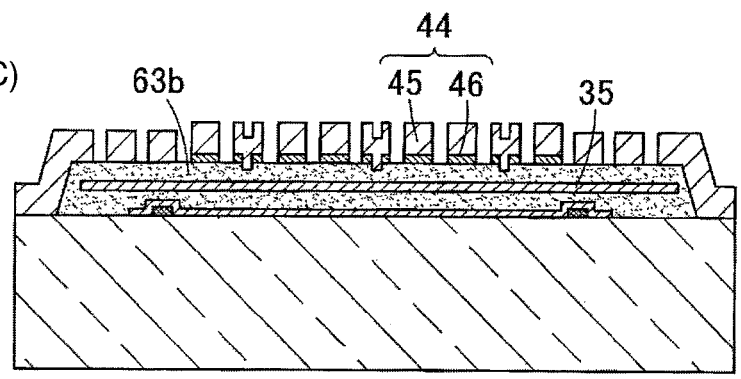

Subsequently, as illustrated in FIG. 8C, SiN is deposited on fixed electrode film 46 to form plate portion 45. Further, acoustic holes 48 are also formed in plate portion 45 to meet the positions of acoustic holes 48 of fixed electrode film 46, and acoustic holes 48 penetrate back plate 44.

When back plate 44 is finished up in this way, the bottom surface of silicon substrate 32 is covered by resist film 67, and the bottom surface side of silicon substrate 32 is subjected to anisotropic etching using an etching solution such as TMAH through an opening of resist film 67. When (100) plane silicon substrate 32 is subjected to anisotropic etching, an etching speed becomes extremely slow in the (111) plane and the crystal plane equivalent to the (111) plane. Therefore, penetration hole 33 of a pyramidal shape formed with the (111) plane and the crystal plane equivalent to the (111) plane is formed in silicon substrate 32.

Figure 8D:
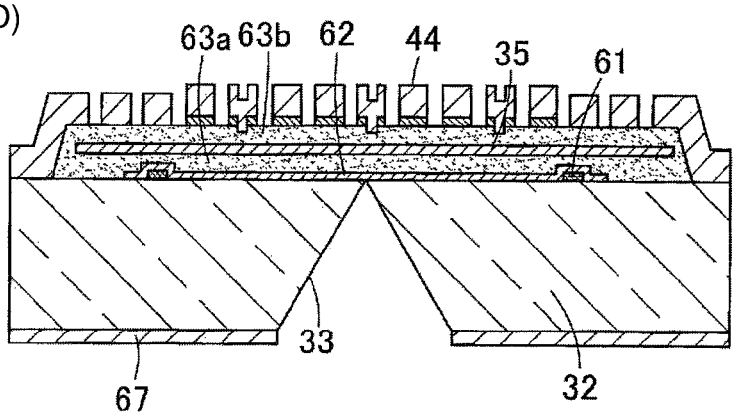
Figure 9A:
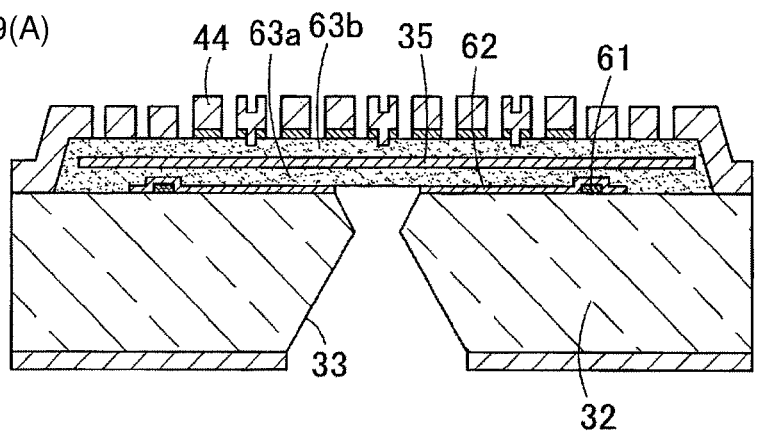
FIGS. 9A to 9C are views continuing from FIGS. 8A to 8C.

When anisotropic etching progresses and penetration hole 33 reaches the top surface of silicon substrate 32 as illustrated in FIG. 8D, second sacrificial layer 62 made of polysilicon is exposed from the top surface of penetration hole 33. When second sacrificial layer 62 is exposed from the top surface of penetration hole 33, the etching solution such as TMAH contacts second sacrificial layer 62, and therefore second sacrificial layer 62 is subjected to isotropic etching by the etching solution as illustrated in FIG. 9A. In this regard, as isotropic etching of second sacrificial layer 62 progresses, anisotropic etching of silicon substrate 32 progresses and penetration hole 33 further horizontally widens.

Further, when penetration hole 33 reaches the top surface of silicon substrate 32, anisotropic etching of penetration hole 33 starts from the upper end to a lower portion. Meanwhile, first sacrificial layer 61 and third sacrificial layer 63 have etching resistances against the etching solution such as TMAH, and are not etched by this etching solution.

Figure 9B:
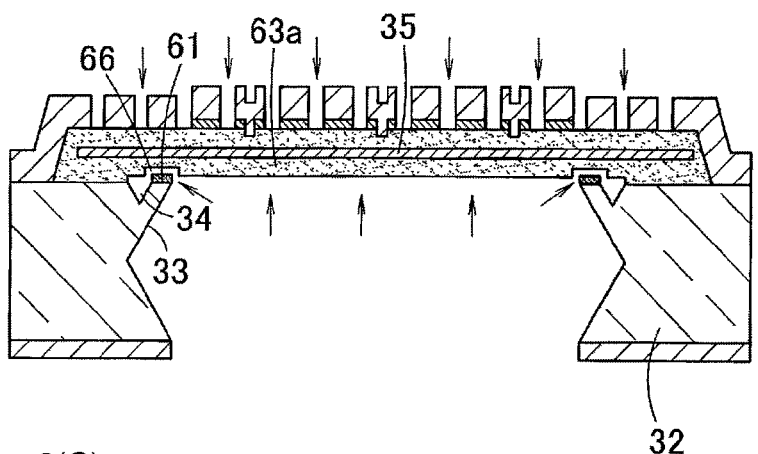

When second sacrificial layer 62 is etched and the portion at which second sacrificial layer 62 exists becomes gap 66, the etching solution such as TMAH passes through gap 66, gets over first sacrificial layer 61 and reaches the top surface of the silicon substrate (region 65 in FIG. 10A) beyond first sacrificial layer 61. As a result, region 65 of silicon substrate 32 is subjected to anisotropic etching and, as illustrated in FIG. 9B, air escape portion 34 is formed in region 65. Even upon anisotropic etching of air escape portion 34, an etching speed is extremely slow on the (111) plane and the crystal plane equivalent to the (111) plane. Therefore, air escape portion 34 has a V groove shape formed with two inclined surfaces 34a, that is, the (111) plane and the crystal plane equivalent to the (111) plane.

In addition, third sacrificial layer 63 is formed between the top surface of second sacrificial layer 62 and the bottom surface of diaphragm 35. Therefore, in the above anisotropic etching process, diaphragm 35 does not contact the etching solution and diaphragm 35 is not etched when second sacrificial layer 62 is removed by etching.

Figure 9C:
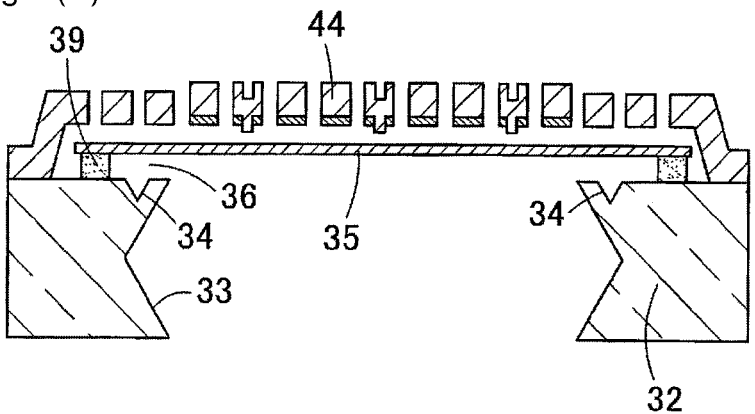

Subsequently, as illustrated in FIG. 9B, an etching solution such as hydrofluoric acid is led through acoustic holes 48 of back plate 44 and penetration hole 33 of silicon substrate 32 to selectively wet-etch first sacrificial layer 61 and third sacrificial layer 63. As illustrated in FIG. 9C, only third sacrificial layer 63 below beam portions 37 is left as anchors 39 and other third sacrificial layer 63 and first sacrificial layer 61 are removed. As a result, diaphragm 35 is separated from the top surface of silicon substrate 32 by anchors 39 and is supported to vibrate on penetration hole 33, and the air gap is formed between fixed electrode film 46 and diaphragm 35.

Acoustic sensor 31 of the first embodiment of the present invention can be manufactured as described above. Consequently, it is not necessary to provide air escape portion 34 in advance by dry etching before a process of forming diaphragm 35, and it is possible to simplify a process of manufacturing acoustic sensor 31 and suppress manufacturing cost.

Further, upon anisotropic etching of a silicon substrate, the etching speed becomes extremely slow on the densest surfaces, that is, the (111) plane and the crystal plane equivalent to the (111) plane. Consequently, it is possible to make air escape portion 34 of a stable shape by making air escape portion 34 by anisotropic etching, and stabilize quality of acoustic sensor 31.

Further, first sacrificial layer 61 only needs to cover a region between penetration hole 33 and air escape portion 34 and to prevent anisotropic etching of the region, so that a very thin film is sufficient. Hence, it becomes more difficult for a step portion of first sacrificial layer 61 to be transferred to the diaphragm 35, and for the shape of first sacrificial layer 61 to be transferred to diaphragm 35, such that it becomes less likely that a stress state of diaphragm 35 is influenced, so that the sensitivity of the acoustic sensor stabilizes.

In addition, when a step portion is produced in diaphragm 35 due to first sacrificial layer 61 and influences the characteristics and the robustness of acoustic sensor 31, the top surface of third sacrificial layer 63 may be polished by a Chemical Mechanical Polishing method (CMP method) before diaphragm 35 is provided on the top surface of third sacrificial layer 63 to smooth the top surface of third sacrificial layer 63 and then form diaphragm 35.

Further, according to the above manufacturing method, the etching solution which can simultaneously etch silicon substrate 32 and second sacrificial layer 62 is used. It is possible to remove second sacrificial layer 62 through the opening of penetration hole 33 and make air escape portion 34 in the single etching process and simplify the process of manufacturing acoustic sensor 31.

By contrast with this, when silicon substrate 32 is subjected to anisotropic etching using an etching solution against which second sacrificial layer 62 has the etching resistance, etching penetration hole 33, etching second sacrificial layer 62 and etching air escape portion 34 need to be individually performed. Therefore, although the number of processes increases, it is possible to independently determine the size of penetration hole 33 and the depth of air escape portion 34.

Other Embodiments

An acoustic sensor can incorporate embodiments of air escape portions of various different modes.

Figure 11A:
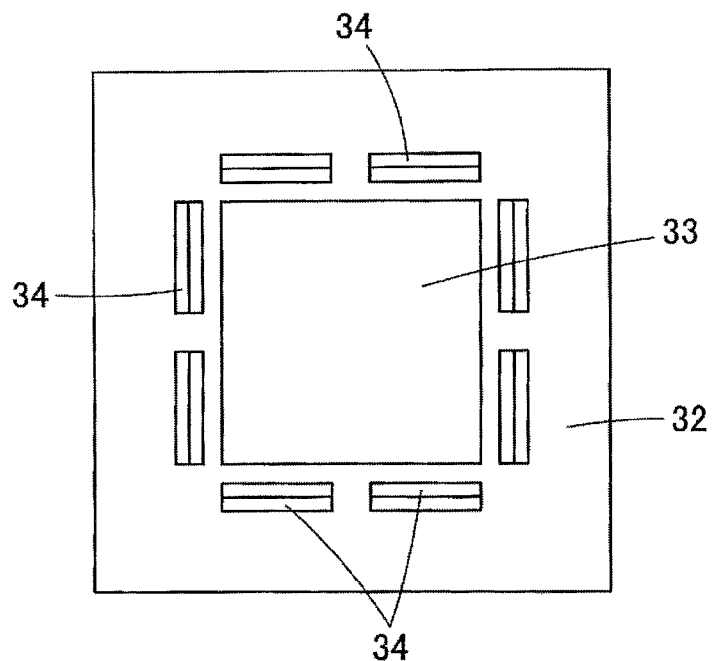
FIG. 11A is a plan view illustrating air escape portions formed on the top surface of the silicon substrate of another embodiment of the present invention.

For example, air escape portion 34 does not need to be continuously provided along the entire circumference of penetration hole 33, and, as illustrated in FIG. 11A, it does not matter even if air escape portions 34 break up at adequate portions.

Particularly, air escape portions 34 desirably break up at portions which become corners such that the corners are not formed. When air escape portion 34 is also continuous to form a corner near a corner portion of penetration hole 33, and when air escape portion 34 is subjected to anisotropic etching, air escape portion 34 widens toward the inner corner side of the corner. Therefore, air escape portion 34 desirably has a planar shape without a corner seen from above.

Figure 11B:
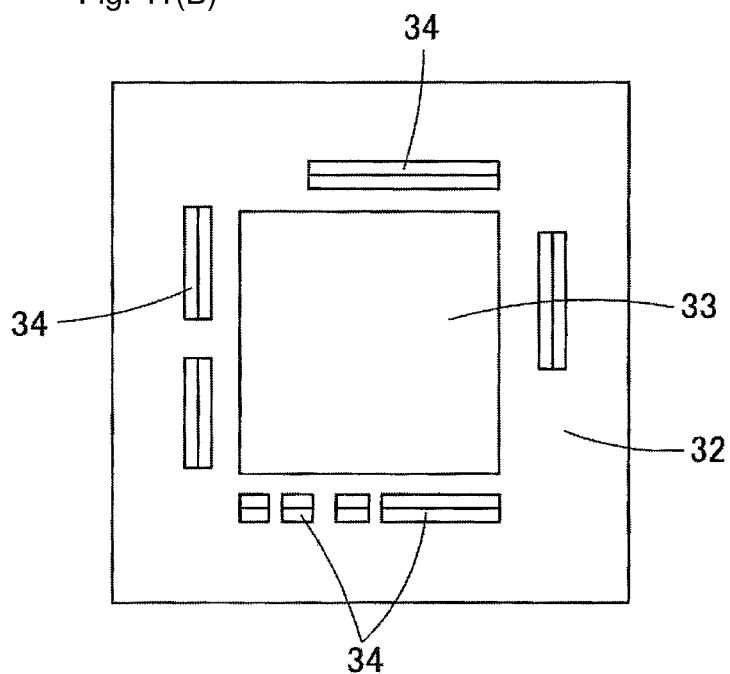
FIG. 11B is a plan view illustrating the air escape portions formed on the top surface of the silicon substrate of another embodiment of the present invention.

Further, air escape portion 34 may be formed at random as illustrated in FIG. 11B. Particularly, the lengths, the number and the positions of air escape portions 34 arranged at a periphery portion of each side of penetration hole 33 do not matter.

Figure 12A:
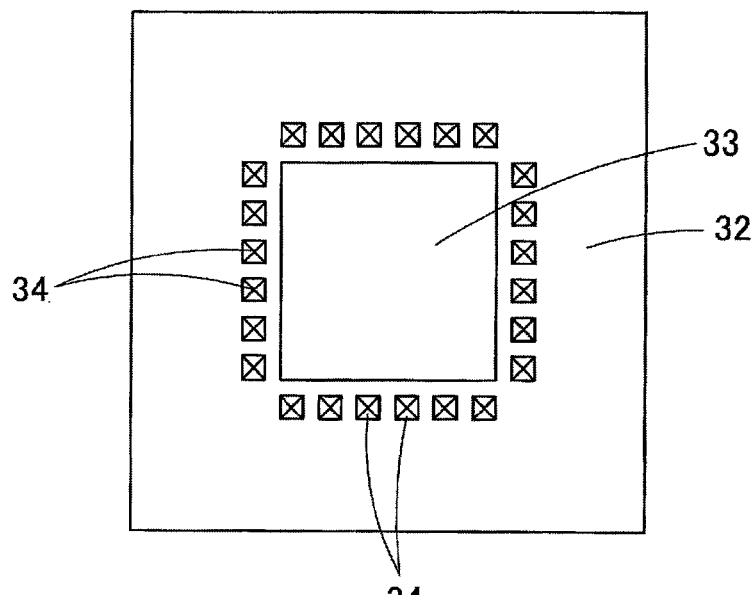
FIG. 12A is a plan view illustrating air escape portions formed on the top surface of the silicon substrate of still another embodiment of the present invention.
Figure 12B:
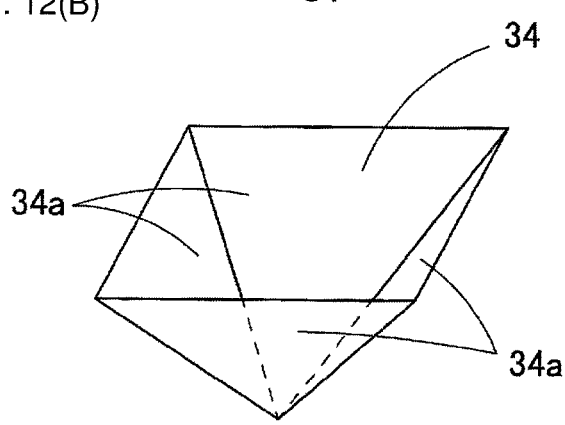
FIG. 12B is a perspective view illustrating one of the air escape portions illustrated in FIG. 12A.

Further, FIG. 12A represents still another embodiment of air escape portions 34 provided to silicon substrate 32. This air escape portion 34 is formed in a reverse quadrangular pyramidal shape by four inclined surfaces 34a as illustrated in FIG. 12B. Air escape portions 34 provided to be dented in the reverse quadrangular pyramidal shapes are arranged at equal intervals or at random along the outer perimeter of penetration hole 33. According to this embodiment, it is possible to adjust the acoustic resistance of the acoustic sensor according to opening areas and depths of air escape portions 34 and, in addition, an array pitch of air escape portions 34.

Figure 13:
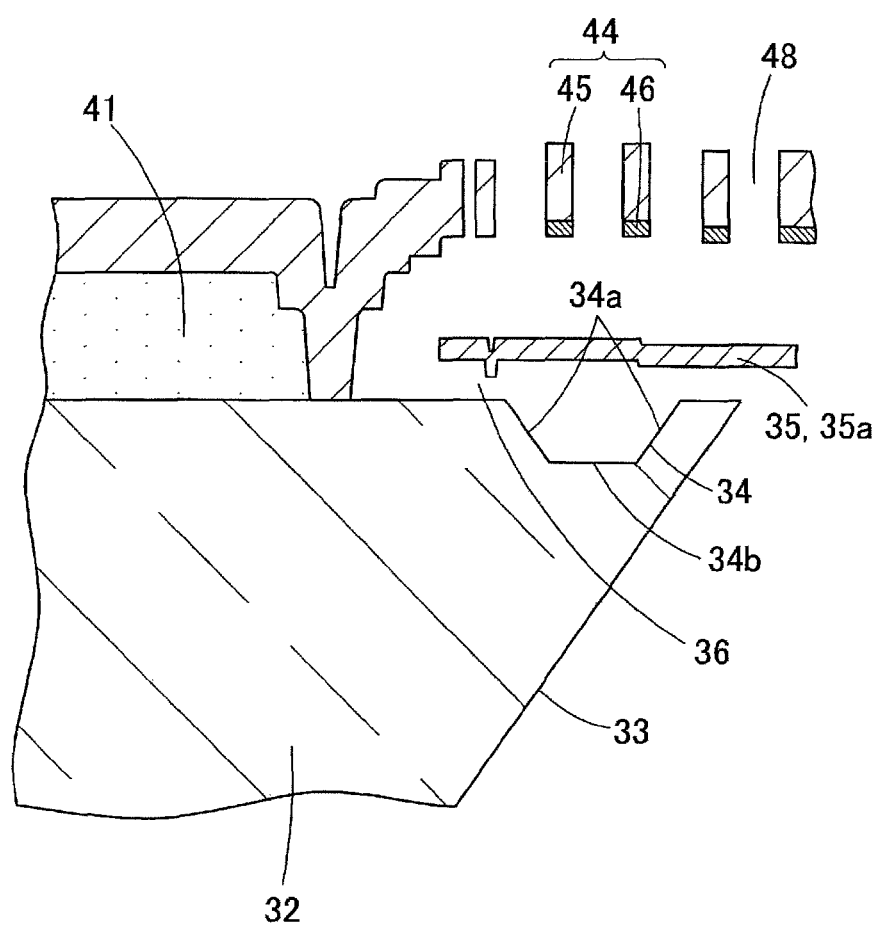
FIG. 13 is a cross-sectional view illustrating part of an acoustic sensor of yet another embodiment of the present invention.

FIG. 13 is a cross-sectional view illustrating yet another embodiment of air escape portion 34 provided to the acoustic sensor. In this embodiment, air escape portion 34 whose cross section has a reverse trapezoidal shape is provided in the circumference of penetration hole 33. That is, this air escape portion 34 is formed with two inclined surfaces 34a formed with the (111) plane and the crystal plane equivalent to the (111) plane, and horizontal surface 34b formed with a (100) plane. Typical air escape portions of this embodiment include air escape portion 34 of a groove shape formed with two inclined surfaces 34a and one horizontal surface 34b, and air escape portion 34 of a reverse quadrangular pyramidal shape formed with four inclined surfaces 34a and one horizontal surface 34b.

Figure 14:
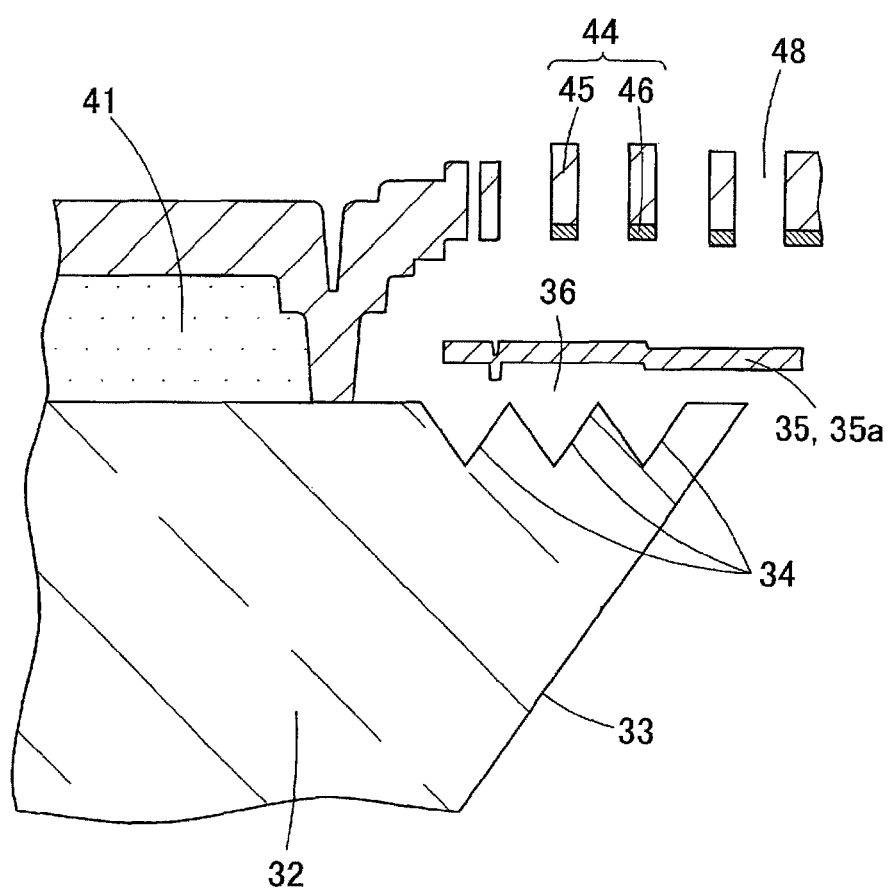
FIG. 14 is a cross-sectional view illustrating part of an acoustic sensor of yet still another embodiment of the present invention.

FIG. 14 is a cross-sectional view illustrating yet still another embodiment of air escape portions 34 provided to the acoustic sensor. In this embodiment, a plurality of arrays of air escape portions 34 of V groove shapes formed in an annular shape along the entire circumference of penetration hole 33, air escape portions 34 of V groove shapes partially formed along the circumference of penetration hole 33, air escape portions 34 of reverse quadrangular pyramidal shapes, air escape portions 34 whose cross sections are dish shapes, and the like, are formed in a plurality of lines aligned in a width direction. Although FIG. 14 illustrates that air escape portions 34 are mutually adjacent in the width direction, air escape portions 34 may sandwich a planar portion and be spaced apart from each other. In addition, each air escape portion 34 only needs to be provided such that at least part of each air escape portion 34 crosses vent hole 36.

Figure 15:
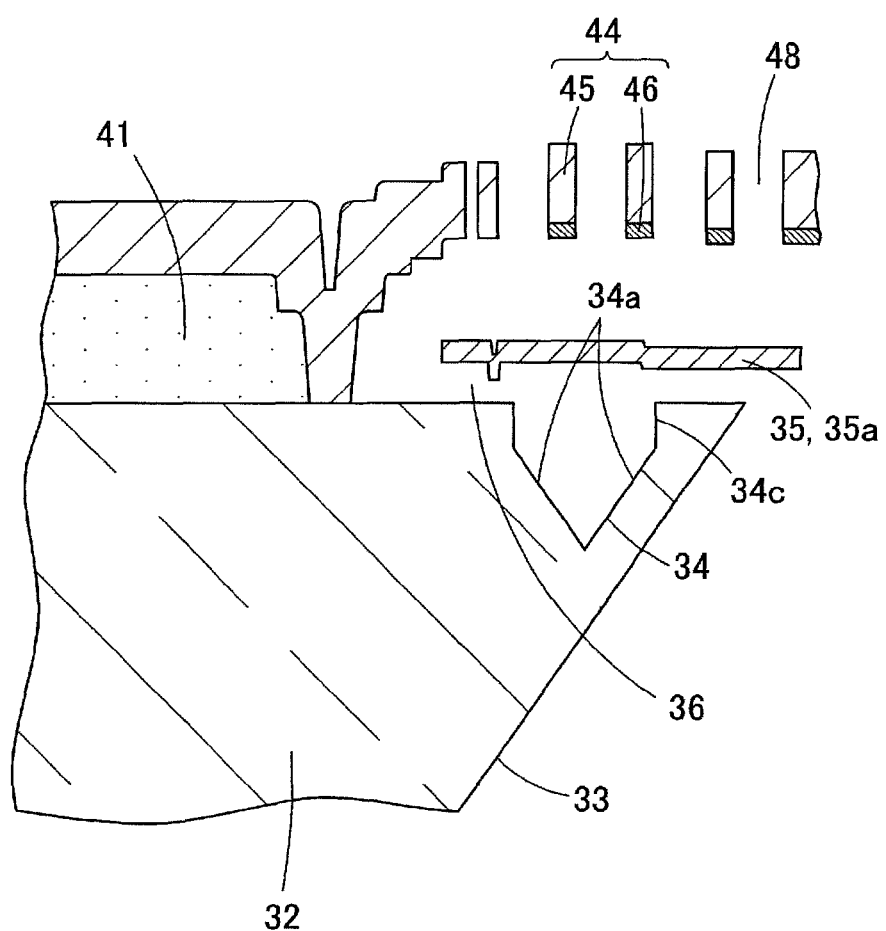
FIG. 15 is a cross-sectional view illustrating part of the acoustic sensor of still further another embodiment of the present invention.

FIG. 15 is a cross-sectional view illustrating still further another embodiment of air escape portion 34 provided to the acoustic sensor. In this embodiment, air escape portion 34 whose cross section has a pentagonal shape is provided in the circumference of penetration hole 33. That is, this air escape portion 34 is formed with two vertical surfaces 34c formed with crystal planes equivalent to (100) planes, and two inclined surfaces 34a formed with a (111) plane and a crystal plane equivalent to the (111) plane. Typical air escape portions of this embodiment include air escape portion 34 of a groove shape formed with two inclined surfaces 34a and two vertical surfaces 34c, and air escape portion 34 formed with four inclined surfaces 34a and four vertical surfaces 34c.

Silicon substrate 32 only needs to be etched by using, for example, anisotropic wet etching and isotropic wet etching in combination to make air escape portion 34 as in FIG. 13 and air escape portion 34 as in FIG. 15.

In addition, in yet still another embodiment of air escape portion 34, the orientations of the inclined surfaces may be changed to an opposite direction at a given depth depending on the degree of progress of anisotropic etching. That is, air escape portion 34 may be formed with inclined surfaces such that, in the upper half of air escape portion 34, a horizontal cross-sectional area of air escape portion 34 gradually increases toward a lower portion. Air escape portion 34 may be formed by inclined surfaces such that, in a lower half of air escape portion 34, a horizontal cross-sectional area of air escape portion 34 gradually decreases toward a lower portion (that is, a shape similar to penetration hole 33 illustrated in FIG. 4).

Further, a ridge or an apex between a plane and a plane of air escape portion 34 may be made round (chamfered). For example, a lowermost end of air escape portion 34 of a reverse quadrangular pyramidal shape may not be a point and may be curved in a spherical shape. Further, the lowermost end of air escape portion 34 of a V groove shape may have a cross section curved in an arc shape.

Furthermore, air escape portion 34 is not limited to a configuration formed with a plurality of planes (inclined surfaces, horizontal surfaces and vertical surfaces), and may be formed with curved surfaces such as spherical surfaces or paraboloidal surfaces.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF SYMBOLS

31 Acoustic sensor
32 Silicon substrate
33 Penetration hole
34 Air escape portion
34a Inclined surface
34b Horizontal surface
34c Vertical surface
35 Diaphragm
36 Vent hole
38 Projection
44 Back plate
45 Plate portion
46 Fixed electrode film
48 Acoustic hole
61 First sacrificial layer
62 Second sacrificial layer
63, 63a, 63b Third sacrificial layer
64 Region which becomes penetration hole
65 Region which becomes air escape portion
66 Gap

The invention claimed is:

1. A capacitance type sensor comprising:
a semiconductor substrate comprising a vertically opened penetration hole;
a movable electrode film arranged above the penetration hole such that a periphery portion is opposite to a top surface of the semiconductor substrate with a gap provided therebetween; and
a fixed electrode film arranged above the movable electrode film with a gap between the fixed electrode film and the movable electrode film,
wherein a concave portion having at least a part thereof formed by an inclined surface is provided in the top surface of the semiconductor substrate in a region of the top surface of the semiconductor substrate which overlaps the periphery portion of the movable electrode film,
wherein the concave portion is formed such that, in at least part of an opening of a top surface of the concave portion to a bottom surface side of the opening in the semiconductor substrate, a cross-sectional area of the concave portion parallel to the top surface of the semiconductor substrate becomes smaller from the opening of the top surface of the concave portion to the bottom surface side of the opening in the semiconductor substrate, and
wherein the inclined surface of the concave portion is formed by a densest crystal plane of a material of the semiconductor substrate.

2. The capacitance type sensor according to claim 1, wherein the concave portion is formed in a groove shape or a reverse quadrangular pyramidal shape.

3. The capacitance type sensor according to claim 1, wherein a plurality of linearly extending concave portions including the concave portion is provided along a rim of the penetration hole in the top surface of the semiconductor substrate.

4. The capacitance type sensor according to claim 1, wherein the movable electrode film includes at least one stopper that projects toward a horizontal surface of a portion of the top surface of the semiconductor substrate which is not provided with the concave portion in a region in which the movable electrode film is opposite to the top surface of the semiconductor substrate with a gap provided therebetween.

5. A method of manufacturing a capacitance type sensor comprising:
   a semiconductor substrate comprising a vertically opened penetration hole;
   a movable electrode film arranged above the penetration hole such that a periphery portion is opposite to a top surface of the semiconductor substrate with a gap provided therebetween; and
   a fixed electrode film arranged above the movable electrode film with a gap between the fixed electrode film and the movable electrode film, the gap above a concave portion having at least a part thereof formed by an inclined surface, in the top surface of the semiconductor substrate in a region of the top surface of the semiconductor substrate which overlaps the periphery portion of the movable electrode film,
   the method comprising:
      forming a first sacrificial layer on the top surface of the semiconductor substrate in a region sandwiched by a region configured to become an opening of a top surface of the penetration hole and a region in which the concave portion is formed;
      forming a second sacrificial layer to cover the top surface of the region in which the concave portion will be formed and connect the top surface of the region in which the concave portion will be formed and at least part of the region configured to become the opening of the top surface of the penetration hole;
      providing the movable electrode film above the first and second sacrificial layers, and forming a third sacrificial layer to cover the first and second sacrificial layers and the movable electrode film;
      providing the fixed electrode film above the third sacrificial layer;
      etching a bottom surface of the semiconductor substrate, forming part or an entirety of the penetration hole in the semiconductor substrate and exposing the second sacrificial layer from a top surface of the penetration hole;
      having a first etching solution contact the second sacrificial layer through the penetration hole and removing the second sacrificial layer;
      having a second etching solution contact the top surface of the semiconductor substrate through a cavity portion after the second sacrificial layer is removed, and forming the concave portion on the top surface of the semiconductor substrate; and
      removing the first and third sacrificial layers by etching.

6. The method of manufacturing the capacitance type sensor according to claim 5, wherein the etching in the forming the concave portion on the top surface of the semiconductor substrate includes at least anisotropic etching.

7. The method of manufacturing the capacitance type sensor according to claim 5, wherein the second sacrificial layer is formed over a top surface of the first sacrificial layer, and between a top surface of a region in which the concave portion is formed and at least part of the region configured to become the opening of the top surface of the penetration hole.

8. The method of manufacturing the capacitance type sensor according to claim 5, wherein a same etching solution is used to form the penetration hole and remove the second sacrificial layer.

9. The method of manufacturing the capacitance type sensor according to claim 5, wherein the semiconductor substrate is a (100) plane silicon substrate.

* * * * *